United States Patent
Cho

(10) Patent No.: US 7,238,559 B2
(45) Date of Patent: Jul. 3, 2007

(54) METHOD OF FORMING SINGLE CRYSTAL SILICON THIN FILM USING SEQUENTIAL LATERAL SOLIDIFICATION (SLS)

(75) Inventor: Se-young Cho, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 332 days.

(21) Appl. No.: 11/051,338

(22) Filed: Feb. 7, 2005

(65) Prior Publication Data

US 2005/0176189 A1 Aug. 11, 2005

(30) Foreign Application Priority Data

Feb. 7, 2004 (KR) ................. 10-2004-0008175

(51) Int. Cl.
*H01L 21/84* (2006.01)
(52) U.S. Cl. ............... 438/166; 438/487; 257/E21.134
(58) Field of Classification Search ............... 438/166, 438/487; 257/E21.134
See application file for complete search history.

(56) References Cited

U.S. PATENT DOCUMENTS 5,817,548 A * 10/1998 Noguchi et al. ............ 438/166
6,316,338 B1 * 11/2001 Jung ......................... 438/487

* cited by examiner

*Primary Examiner*—Chandra Chaudhari
(74) *Attorney, Agent, or Firm*—Buchanan Ingersoll & Rooney PC

(57) ABSTRACT

Provided is a method of forming a single crystal silicon thin film using an SLS method and a patterned grain boundary filtering region. The method of forming a single crystal silicon thin film by crystallizing an amorphous silicon layer deposited on a substrate, includes patterning the amorphous silicon layer to have a second region having a narrower width than the first and third regions to prevent grain boundaries from reaching the third region, wherein the second region connects a first region where the crystallization commences and the third region where a single crystal without beam boundaries can grow, partially forming a mask layer on the first region, and crystallizing the amorphous silicon layer by irradiating a laser beam from the first region to the third region in steps using a linear beam SLS method.

19 Claims, 19 Drawing Sheets

FIRST IRRADIATION

SECOND IRRADIATION

AFTER SEVERAL IRRADIATIONS

FIRST IRRADIATION

SECOND IRRADIATION (a)　　　　　　　　　　　　(b)

(a)  (b)

METHOD OF FORMING SINGLE CRYSTAL SILICON THIN FILM USING SEQUENTIAL LATERAL SOLIDIFICATION (SLS)

BACKGROUND OF THE DISCLOSURE

Priority is claimed to Korean Patent Application No. 2004-8175, filed on Feb. 7, 2004, in the Korean Intellectual Property Office, the disclosure of which is incorporated herein in its entirety by reference.

FIELD OF THE DISCLOSURE

The present disclosure relates to a method of forming a single crystal silicon thin film, and more particularly, to a method of forming a single crystal silicon thin film using a sequential lateral solidification method after forming a patterned grain boundary filter.

DESCRIPTION OF THE RELATED ART

A core component of a flat display such as a liquid crystal display (LCD) is a switching device, e.g., a thin film transistor (TFT). Conventionally, a channel of a thin film transistor is composed of amorphous silicon or silicon in a crystal state formed by crystallizing amorphous silicon. However, amorphous silicon (a-Si) can not be used for high speed operation since its charge mobility is low, and accordingly, a-Si cannot be applied to a high resolution display. Silicon in a poly-crystal state has charge mobility more than one hundred times faster than that of a-Si. Therefore, poly-crystal state silicon can be applied to a display panel without additional driving circuit, thereby enabling cost reduction and the realization of a large area high resolution display with a slim design.

Methods of crystallizing an amorphous silicon thin film deposited on a substrate include an excimer laser annealing (ELA) method and a solid phase crystallization (SPC) method. However, recently, improved ELA methods such as a metal induced lateral crystallization (MILC) method and a continuous grain solidification (CGS) method have been used. In these methods, the amorphous silicon thin film is crystallized into a poly-silicon thin film.

However, due to the large number of grain boundaries, charge flow is hindered even in a poly-crystal silicon thin film. Therefore, to obtain improved electric characteristics, a whole region where the thin film transistor is formed should be formed from a single crystal silicon. A sequential lateral solidification (SLS) method has been used to meet this requirement. The SLS method is the most advanced method of laser crystallization. After growing large silicon crystals on a specific region, a thin film transistor is formed on the large silicon crystals.

FIGS. 1A through 1D are drawings for describing a process of crystallizing using a linear beam method, which is a conventional SLS method. Referring to FIG. 1A, a linear beam having a width L is vertically irradiated (first irradiation) onto amorphous silicon from directly above, and the amorphous silicon is completely melted. Then, crystallization begins at both boundaries onto which the laser was irradiated and gradually moves inward. The grain boundary of crystal proceeds at approximately 90° to the laser beam boundary. After the crystallization is completed, as depicted in FIG. 1B, the laser is moved a distance of L/2 and irradiated (second irradiation) onto the amorphous silicon from above until the amorphous silicon is completely melted. Then, crystallization begins at both boundaries on which the laser was irradiated. At this time, the crystallization proceeds continuously from a region 10 where crystallization has already occurred.

Therefore, when crystallizing the whole amorphous silicon thin film in this manner, crystal grains with large and continuous, in which grain boundaries are formed in one direction, are grown. If a TFT extending in the grain boundary direction is formed as depicted in FIG. 1D, a TFT having high electrical characteristics can be obtained since the number of boundary lines is much less than in a conventional transistor.

However, since there are still many grain boundaries, a chevron beam SLS method has been proposed to further reduce the number of grain boundaries. FIGS. 2A through 2D are drawings for describing a process of crystallizing silicon using a conventional chevron beam SLS method. In the chevron beam SLS method, a laser is continuously irradiated in chevron-shaped pulses. Referring to FIG. 2A, a chevron-shaped laser having a pulse width L is vertically irradiated (first irradiation) onto the amorphous silicon from above, and the amorphous silicon is completely melted from top to bottom. Then, crystallization begins at both boundaries of the amorphous silicon and proceeds inward. Since the grain boundary proceeds at approximately 90° to the laser beam boundary, as depicted in FIG. 2A, a single crystal region 30 with a large rectangular shape without grain boundaries is formed.

Then, referring to FIG. 2B, the laser is moved in a direction indicated by an arrow 35 to match between the boundary portion of the single crystal region 30 and the boundary portion of the laser beam, and then, the amorphous silicon is melted from top to bottom. Then, as shown in FIG. 2B, the single crystal 30 grows without a grain boundary. After proceeding in this manner, as depicted in FIG. 2c, a very large single crystal region 30 can be obtained. However, from a practical experiment, as shown in FIG. 2d, a number of fine grain boundaries are formed due to the internal stress of silicon during crystallization and the actual grain boundary-free region is relatively small. However, this method enables obtaining a very large single crystal silicon thin film compared to a conventional method.

However, this method has a few major drawbacks. First, unlike with the linear beam SLS method, it is impossible to crystallize the whole region of a substrate with a mask using the beam SLS method.

The general the SLS method will now be described. Referring to FIG. 3, a laser beam emitted from a laser 42 is reflected by a mirror 43 vertically onto a substrate 47, and a mask 45 transmits part of the laser beam with a specific shape to be irradiated onto the substrate 47. When crystallization is completed in a region on which the laser beam has been irradiated, a next region is crystallized by moving a motion stage 48. On the other hand, in the chevron beam method, only a small region on which a transistor will be formed is crystallized, not all of the amorphous silicon. Since there are a variety of locations and directions of thin film transistors to be formed in an array on a substrate, in order to meet every requirement of each transistor, every transistor region must be crystallization individually. Therefore, the chevron beam SLS method has disadvantages of low productivity and difficulty with respect to mass production.

In a subsequent process, source and drain regions of the transistor are patterned on the single crystal silicon region 30. At this time, very precise patterning is required since the single crystal silicon region 30 is very small. There is no problem when the source region and the drain region are patterned correctly in the single crystal silicon region 30 as shown in FIG. 4(a), but, as shown in FIG. 4(b), if there is an error of about 5–20 μm, a portion of the source region and the drain region may deviate from the crystallized region. This problem may cause a defect in a subsequent process.

Moreover, the grain boundaries can not be completely removed by the chevron SLS method, and, as depicted in FIGS. 5(a) and 5(b), a significant number of grain boundaries can still occur in the single crystal silicon region 30. In this case, as depicted in FIG. 5, a grain boundary can occur along a direction in which current flows through the thin film transistor, and charge mobility is reduced about by 10–30%. In a more severe case, as depicted in FIGS. 6(a) and 6(b), the grain boundary occurs in a direction perpendicular to the direction in which the current flows through the thin film transistor, and in this case, charge mobility is reduced by more than 50%.

Because of these problems, despite the disadvantages of lower crystallinity and charge mobility compared with the chevron beam SLS method, the linear beam SLS method which secures uniformity is widely used, even though a greater number of grain boundaries are formed.

SUMMARY OF THE DISCLOSURE

Embodiments of the present disclosure provide a method of forming a single crystal silicon thin film that has substantially no grain boundaries.

Embodiments of the present disclosure also provide a method of forming a single crystal silicon thin film in which defects are substantially not formed in a process of forming a thin film transistor and which can be used for mass production.

According to an aspect of the present disclosure, there is provided a method of forming a single crystal silicon thin film by crystallizing an amorphous silicon layer deposited on a substrate, comprising: patterning the amorphous silicon layer to have a second region having a narrower width than the first and third regions to prevent grain boundaries from reaching the third region, wherein the second region connects a first region where the crystallization commences and the third region where a single crystal without beam boundaries can grow; partially forming a mask layer on the first region; and crystallizing the amorphous silicon layer by irradiating a laser beam from the first region to the third region in steps.

A width of a portion of the third region is tapered to gradually decrease toward the second region.

As described above, conventionally, the amorphous silicon is crystallized using a laser after depositing the amorphous silicon on an Si layer. Then, a thin film silicon island is formed by patterning the crystallized silicon layer and then a thin film transistor is formed on the patterned thin film silicon island.

However, in the present disclosure, while an amorphous silicon is also deposited on a Si layer, the Si layer is patterned to form a thin film silicon island for forming the thin film transistor, and then a reflection mask is patterned before crystallizing the amorphous silicon. Then, the patterned thin film silicon island is crystallized using a linear beam SLS method, and then a thin film transistor is formed thereon. A thin film silicon island having a single crystal region without grain boundaries is obtained by an interaction of the reflection mask and the grain boundary filtering region.

BRIEF DESCRIPTION OF THE DRAWINGS

The above and other features and advantages of the present disclosure will become more apparent by describing in detail exemplary embodiments thereof with reference to the attached drawings in which.

DETAILED DESCRIPTION OF THE INVENTION

The present disclosure will now be described more fully with reference to the accompanying drawings in which embodiments of the disclosure are shown.

Figure 1A:
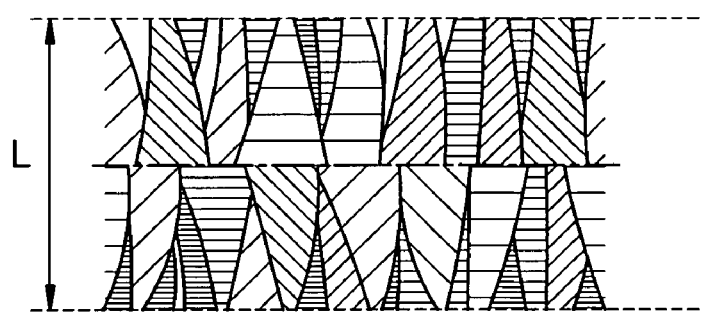
FIGS. 1A through 1D illustrate a process of crystallizing using a conventional SLS method.
Figure 1B:
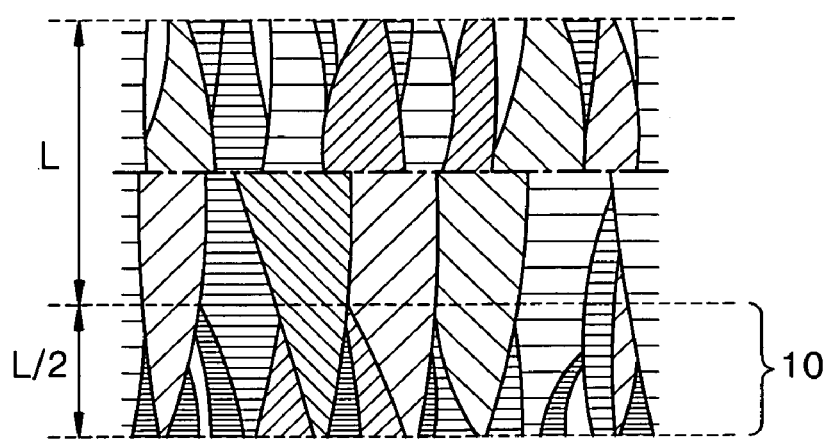
Figure 1C:
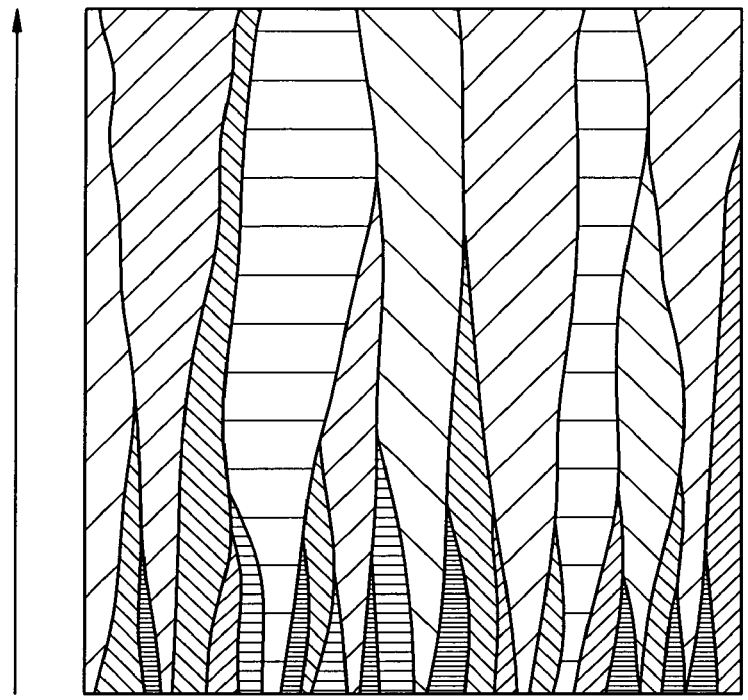
Figure 1D:
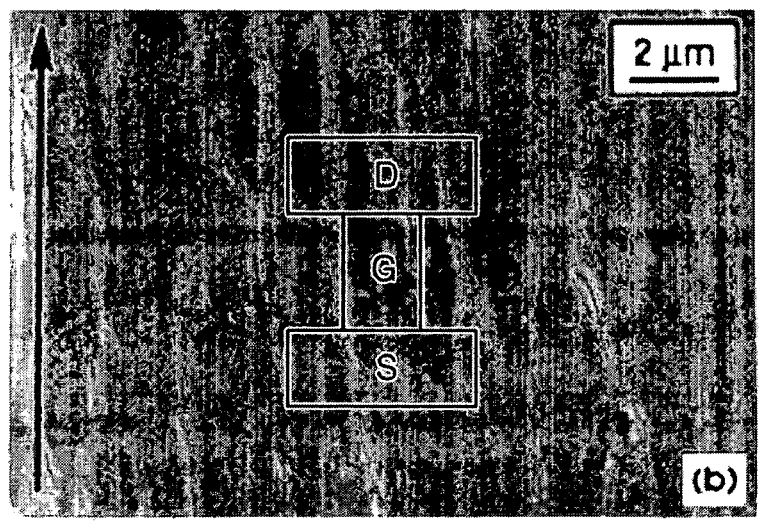
Figure 2A:
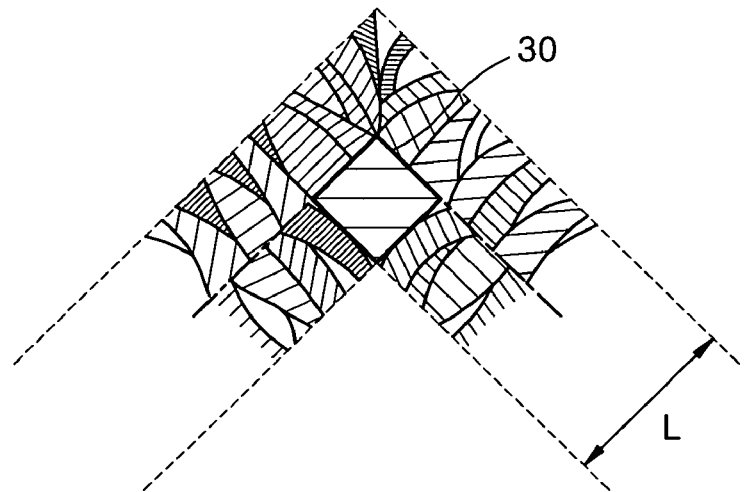
FIGS. 2A through 2D illustrate a process of crystallizing silicon using a conventional chevron beam SLS method.
Figure 2B:
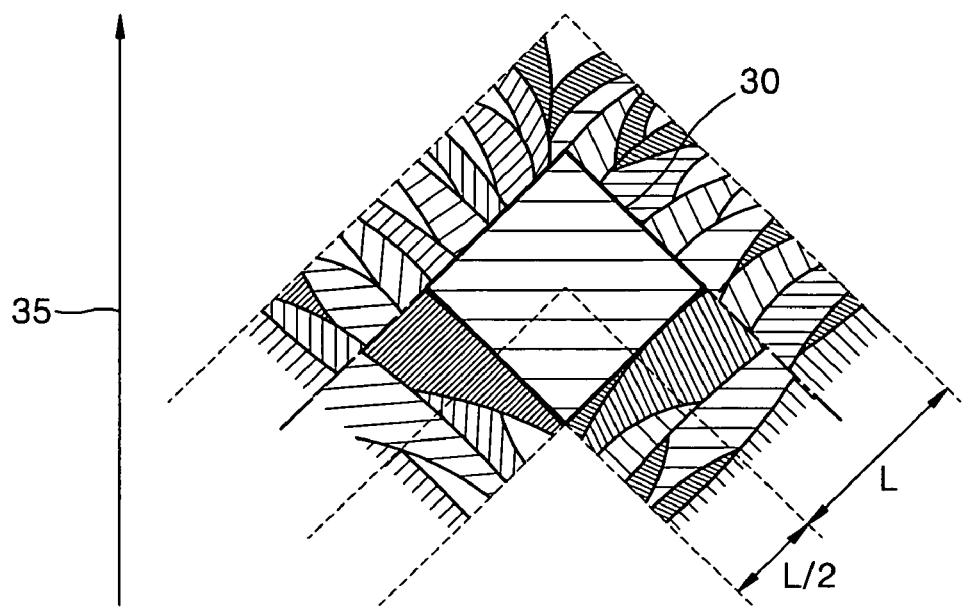
Figure 2C:
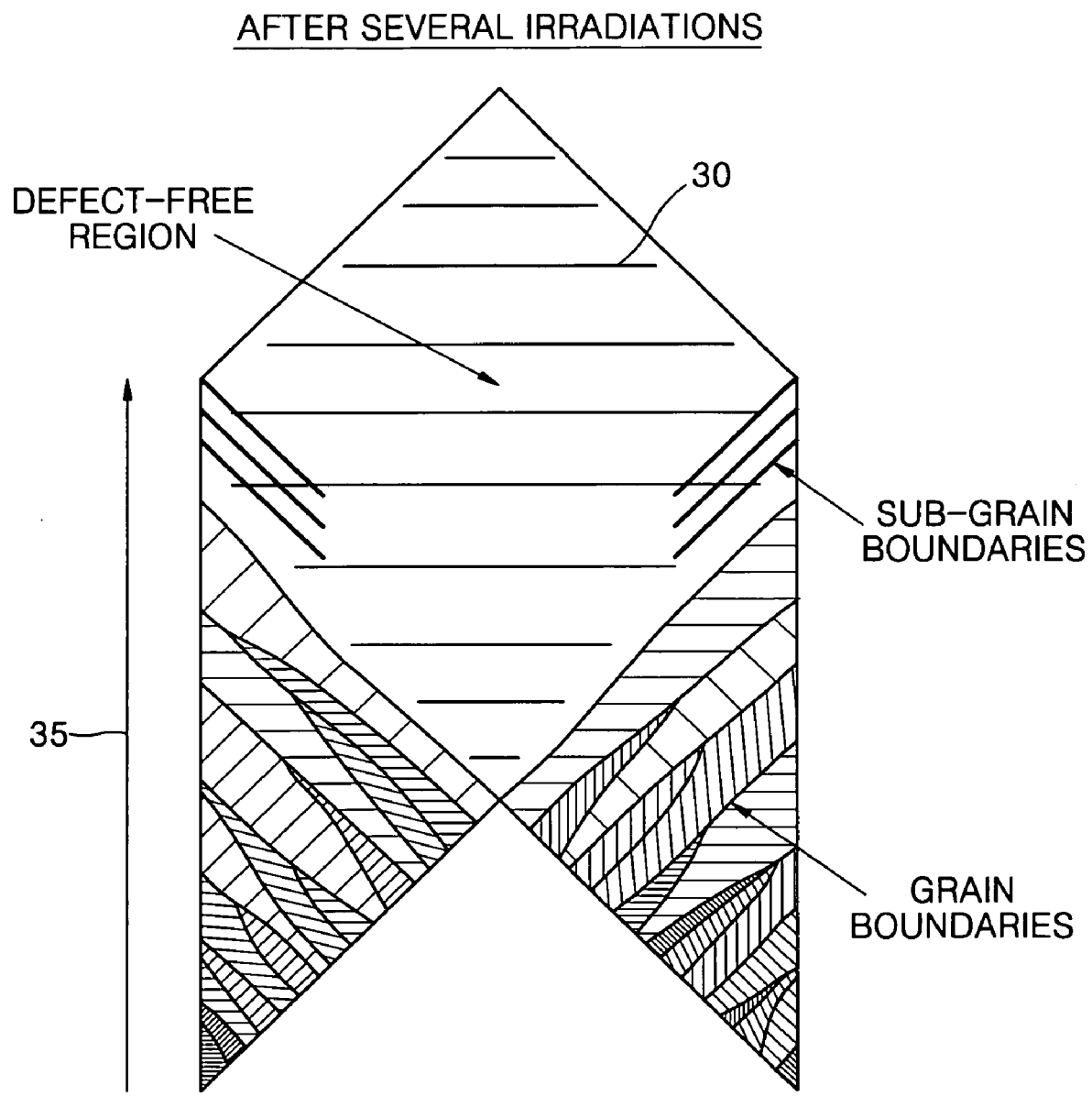
Figure 2D:
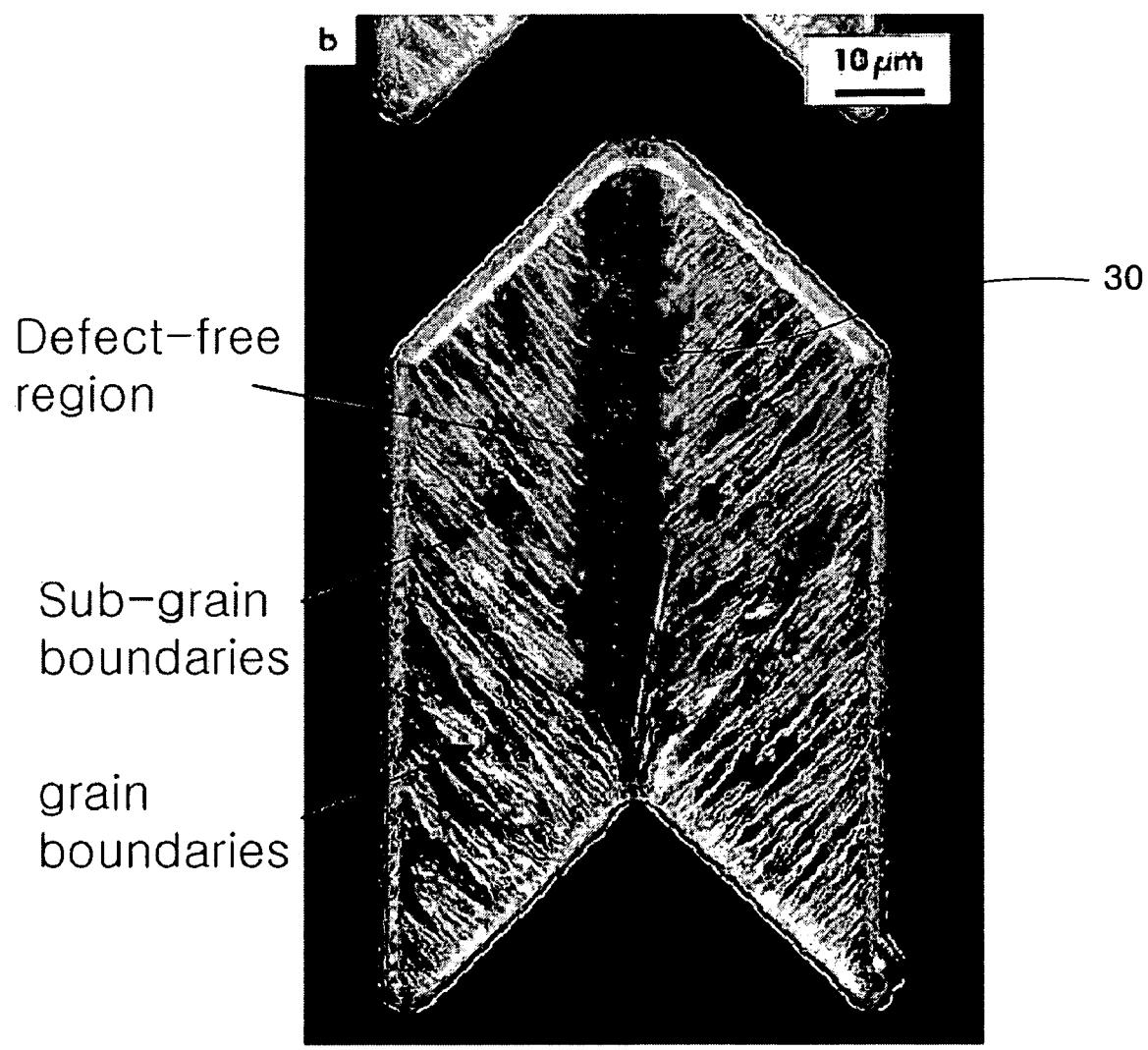
Figure 3A:
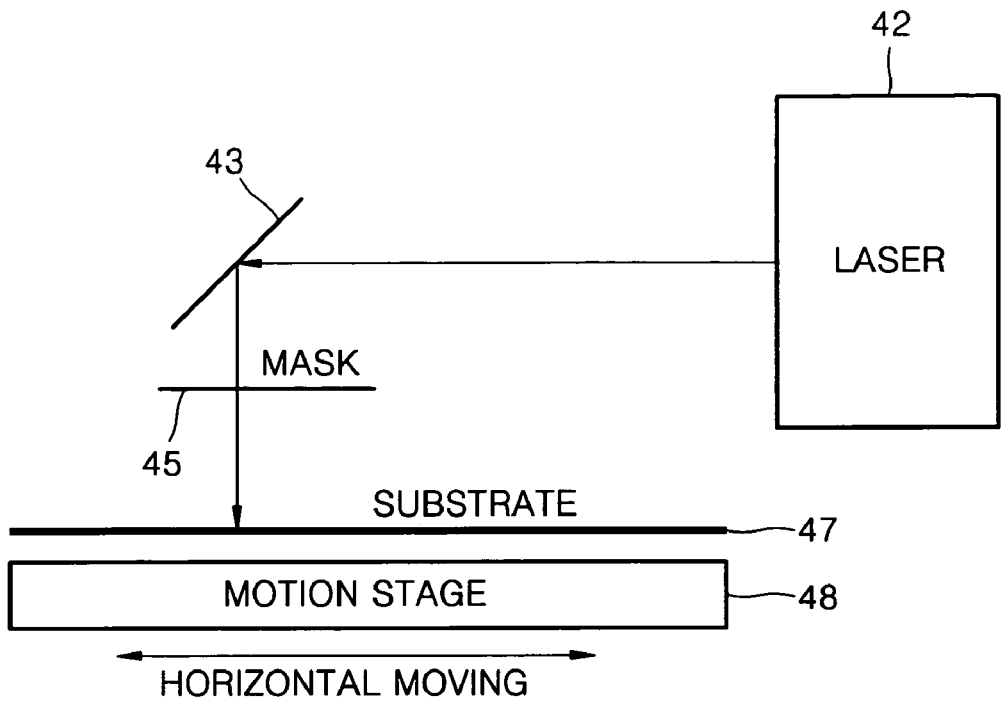
FIGS. 3A and 3B are schematic drawings illustrating a method of processing TFT regions using the conventional chevron beam SLS method.
Figure 3B:
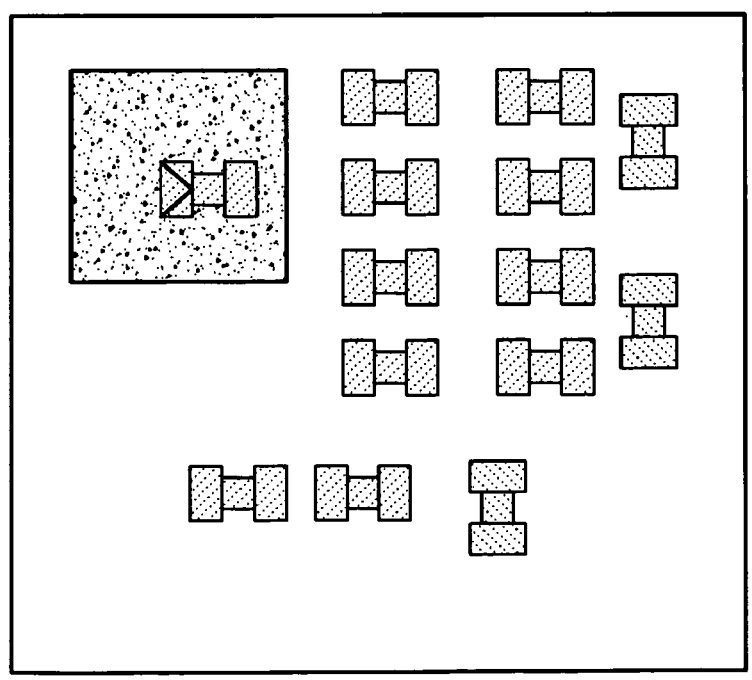
Figure 4:
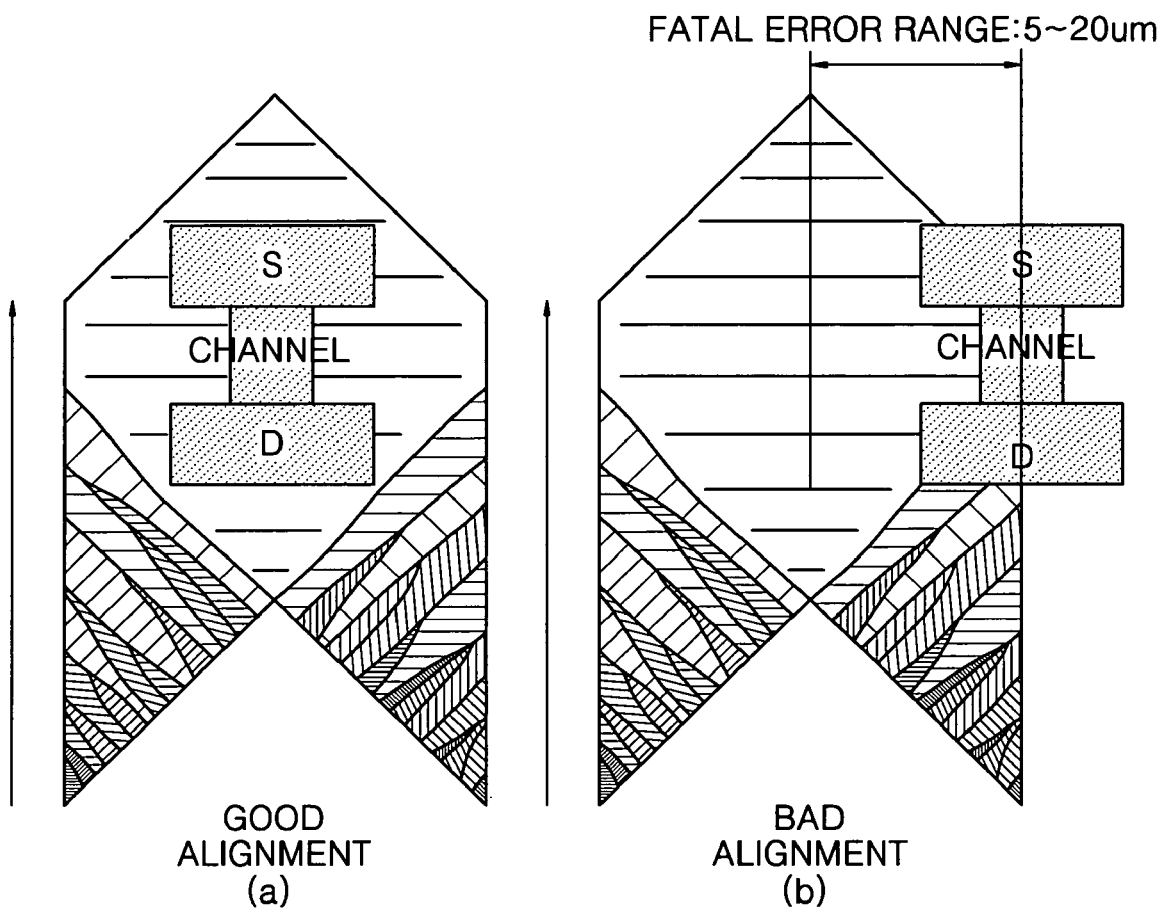
FIGS. 4 through 6 illustrate a problem that can occur when forming a thin film transistor on a single crystal silicon thin film formed using the conventional chevron beam SLS method.
Figure 5:
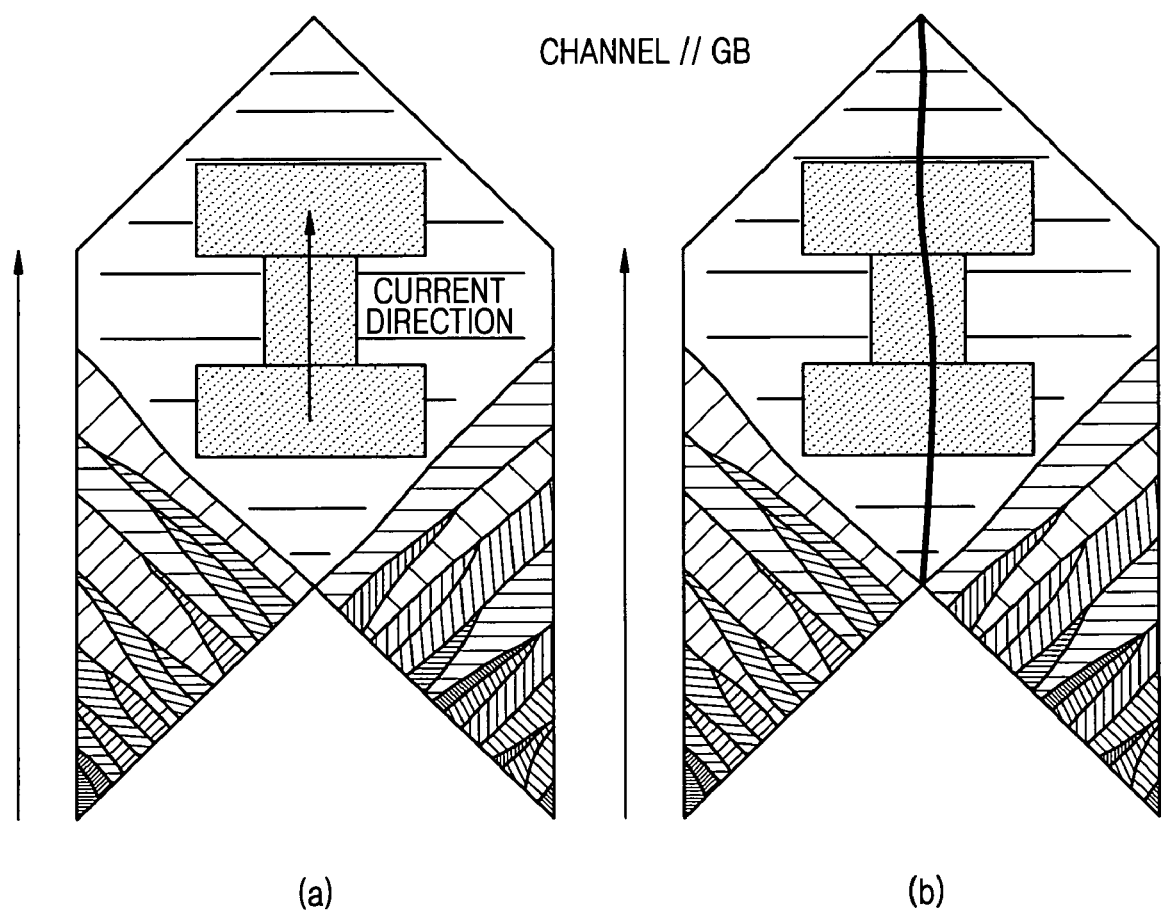
Figure 6:
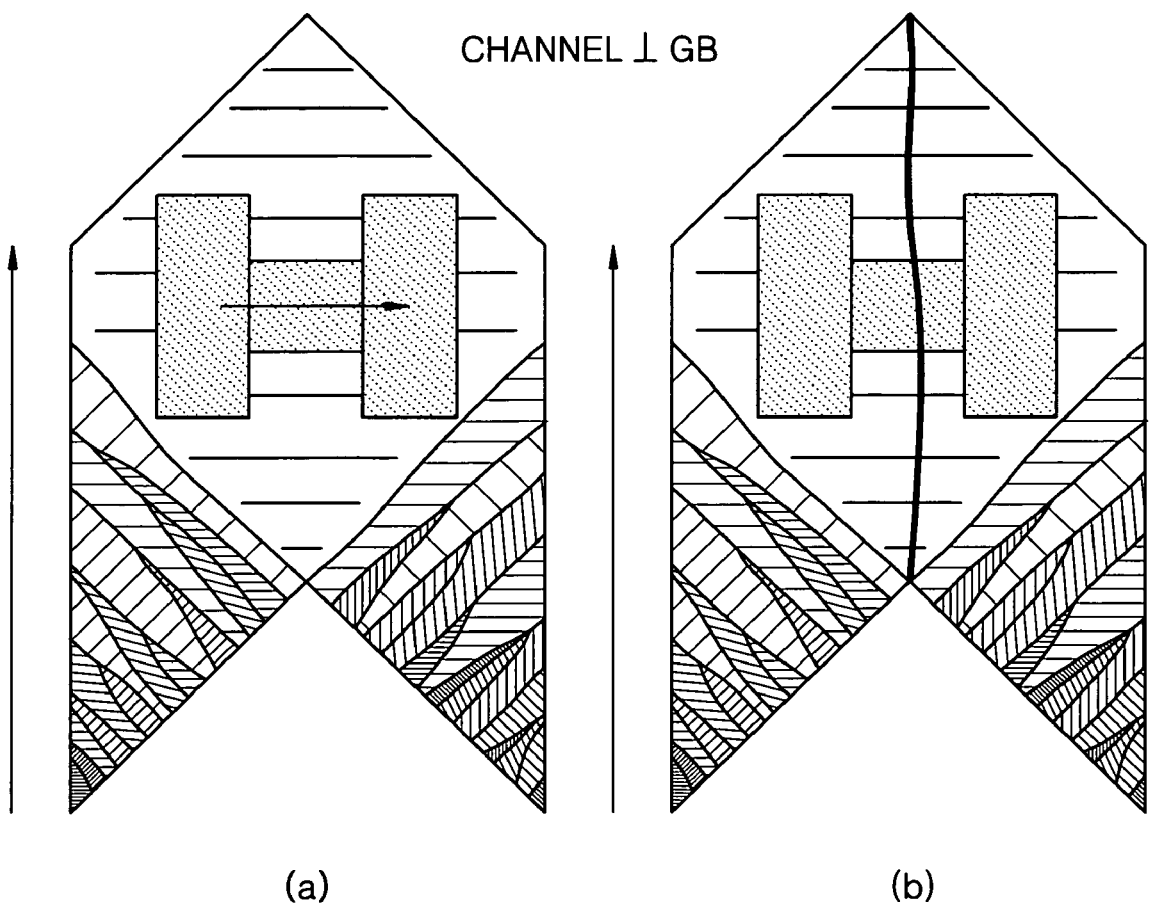
Figure 7A:
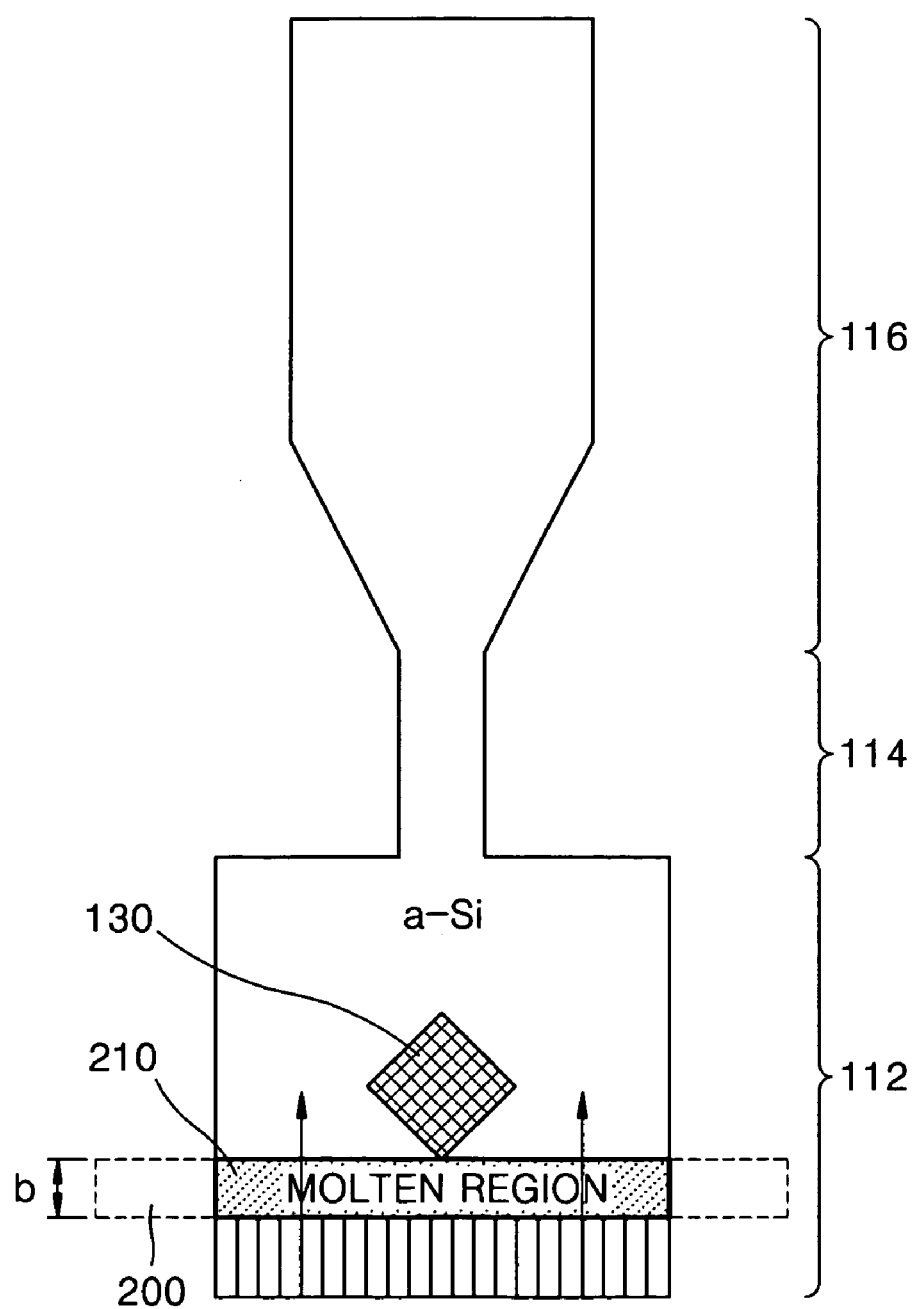
FIGS. 7A through 7E are schematic drawings illustrating a crystallizing process according to a first embodiment of the present disclosure.

FIGS. 7A through 7E are schematic drawings illustrating a crystallizing process according to a first embodiment of the present disclosure, and it is plan view of a silicon layer to be crystallized. FIG. 8 is a cross-sectional view illustrating each of the layers formed on a substrate in the crystallizing process. Referring to FIG. 8, after depositing an amorphous silicon (a-Si) layer 110 on a buffer layer 105 composed of a material such as $SiO_2$, the a-Si layer 110 is patterned to a shape depicted in FIG. 7A. After depositing an insulating layer 120 composed of a material such as $SiO_2$, a reflection mask 130 composed of a metal having high reflectance such as aluminum Al is deposited on the insulating layer 120. The reflection mask layer 130 and the insulating layer 120 are patterned to a shape as depicted in FIG. 7A.

The shape of the patterned a-Si layer 110 and the reflection mask layer 130 will now be described with reference to FIGS. 7A–7E. The a-Si layer 110 includes a growing commencing region 112 with a rectangular shape, a grain boundary filtering region 114 extending from a center of an edge of the growing commencing region 112 and being narrower than the growing commencing region 112, and a grain boundary-free single crystal region 116 that has a greater width than the grain boundary filtering region 114 and has a tapered region connected to the grain boundary filtering region 114. Therefore, in the patterned a-Si layer 110, the grain boundary filtering region 114 is sunken, and the width of the grain boundary-free single crystal region 116 gradually increases as the distance from the boundary between the grain boundary filtering region 114 and the grain boundary-free single crystal region 116 and becomes uniform after a certain distance from the boundary. Crystallization commences in the growing commencing region 112 and proceeds toward the grain boundary filtering region 114 and the grain boundary-free single crystal region 116.

As depicted in FIGS. 7A through 7E, the reflection mask layer 130 having windings or edges is formed on the patterned a-Si layer 110 to change the direction in which the grain boundary forms and to form a seed region for a single crystal region. An insulating layer 120 composed of a material such as $SiO_2$ is interposed between the reflection mask layer 130 and the a-Si layer 110 as shown in FIG. 8. The reflection mask layer 130 can have a rectangular or a triangle shape. The reflection mask layer 130 can be centered between opposite sides of the growing commencing region 112 not contacting the grain boundary filtering region, and it is desirable that the reflection mask layer 130 is symmetrical about a center line centered between the opposite sides of the grain commencing region 112. Also, an apex of the reflection mask layer 130 facing a direction in which the laser proceeds can be located on the center line. That is, the apex of the reflection mask layer 130 locates on a region facing grain boundary filtering region 114.

After forming the a-Si layer 110 and the reflection mask layer 130, a silicon crystallization process of a sequential lateral solidification (SLS) method is performed using an excimer laser (not shown). The silicon crystallization process is sequentially depicted in FIG. 7A through FIG. 7D. As depicted in FIGS. 7A through 7D, in the silicon crystallization process of the SLS method, crystallization commences at one end of the growing commencing region 112 and ends at the grain boundary-free single crystal region 116. The laser beam is moved in the same way as in the linear beam SLS method.

In FIG. 7A, a rectangular region 200 indicated by dotted lines represents a region on which the laser beam is irradiated, and a rectangular region 210 indicated by solid lines represents a region melted by the irradiation of the laser beam. The arrows indicate a moving direction of laser. First, a long linear laser beam having a predetermined beam width b is vertically irradiated onto the a-Si layer 110 from an end of the growing commencing region 112, and the amorphous silicon is completely melted from top to bottom. Then, crystallization commences at both boundaries on which the laser is irradiated and proceeds inward. At this time, the grain boundary spreads in a direction about 90° to the laser beam boundary. When the crystallization is completed, the laser is moved a predetermined distance, i.e., less than b, so that the laser is above part of the region already irradiated and the amorphous silicon is completely melted from top to bottom in the new region. Then, crystallization proceeds from the crystals already formed by a previous crystallization process. In this manner, a plurality of grain boundaries are formed along the moving direction of the laser approximately parallel to each other.

Figure 7B:
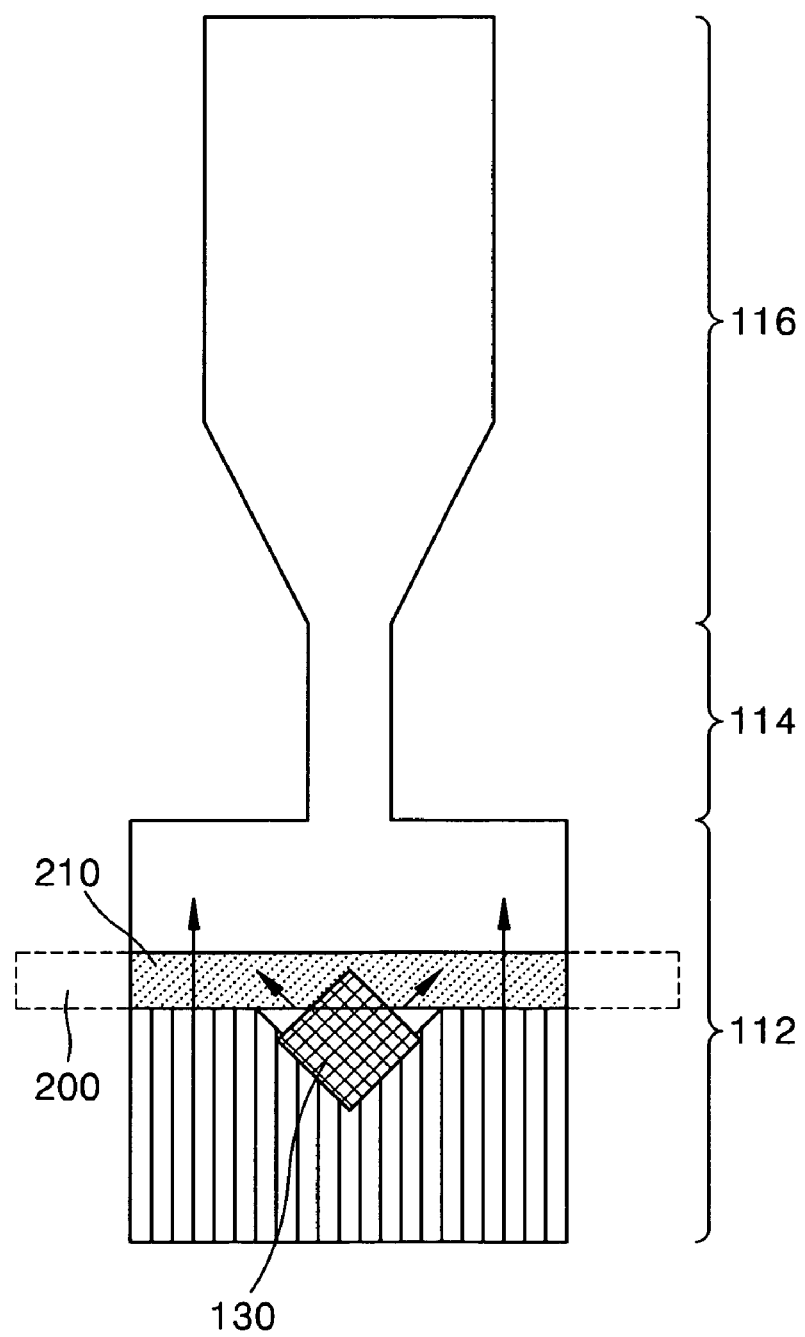
Figure 7C:
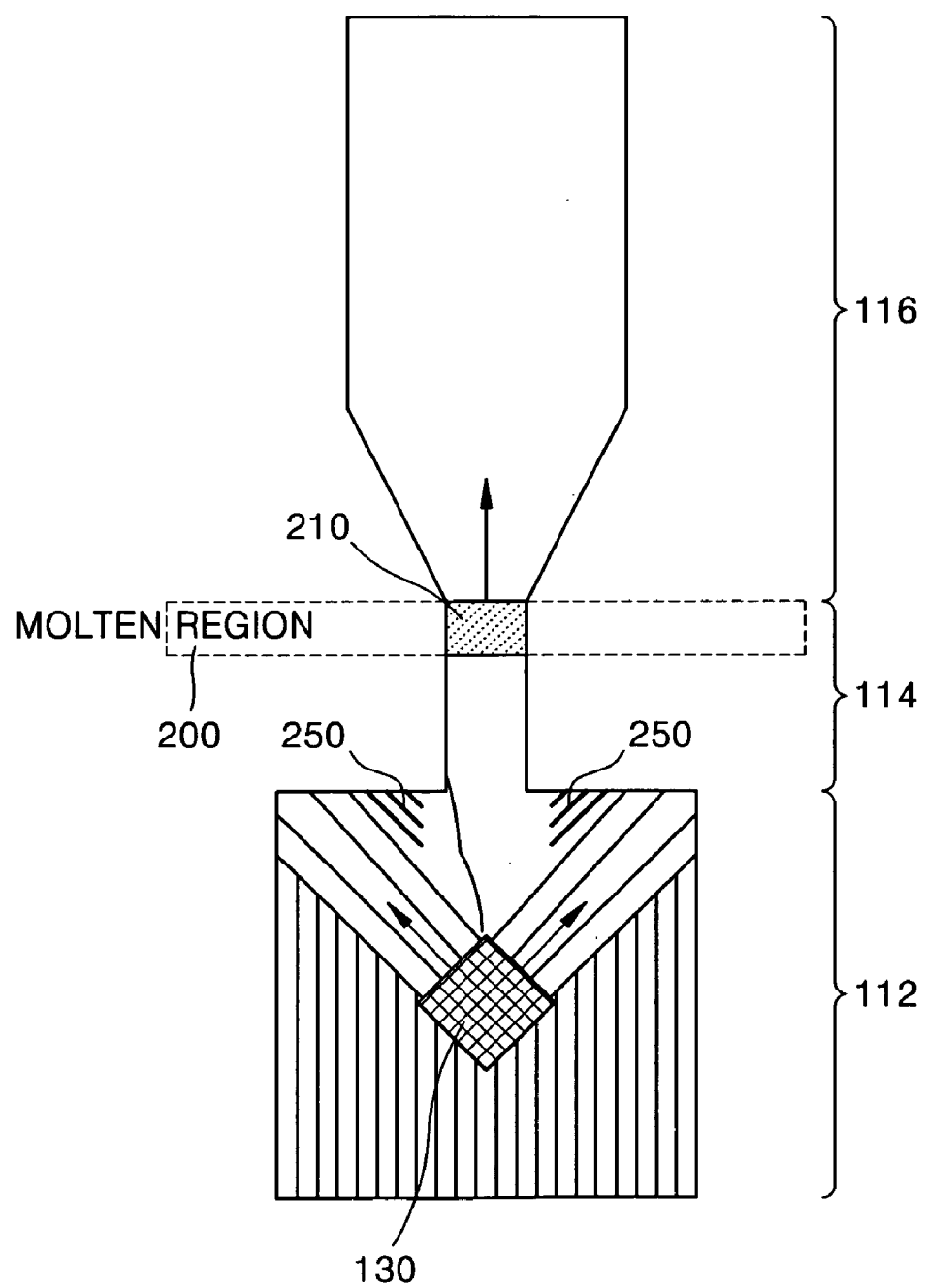
Figure 8:
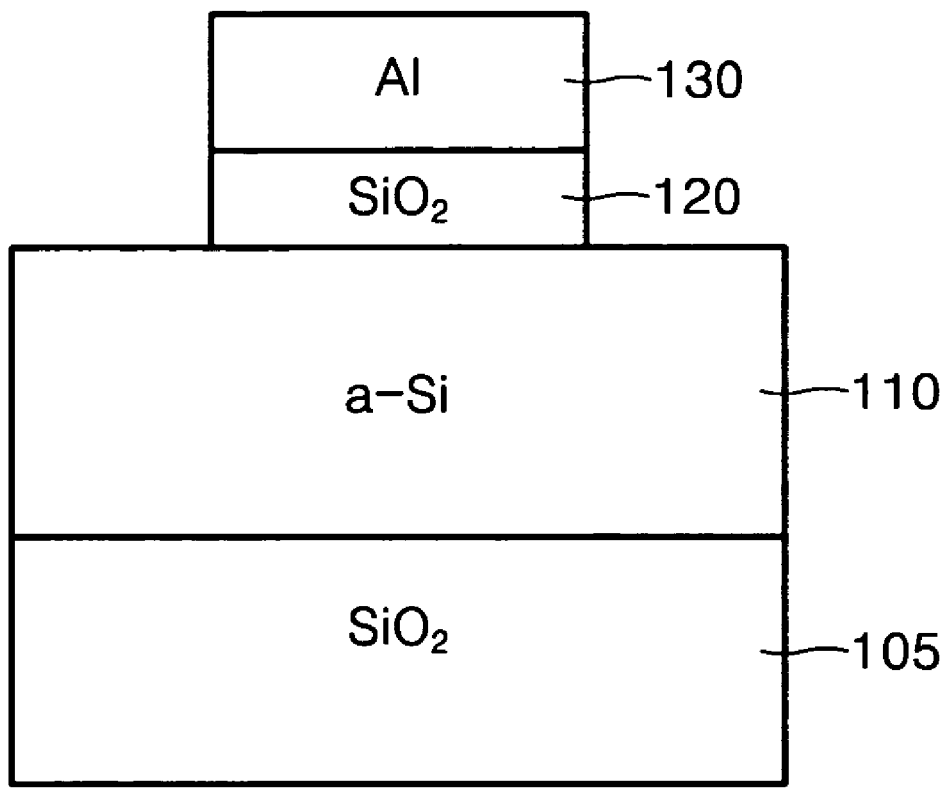
FIG. 8 is a cross-sectional view illustrating each of the layers formed on a substrate in the crystallizing process.

Next, referring to FIG. 7B, a laser beam is irradiated onto the reflection mask layer 130. The reflection mask layer 130 prevents transmission of the laser beam, and can be a metal layer that reflects light such as an aluminum layer. Therefore, the amorphous silicon layer under the reflection mask layer 130 is not melted by the laser. Accordingly, in a region below the reflection mask layer 130, grain boundaries formed during earlier crystallization are disconnected and new grain boundaries are formed. At this time, since the width of the reflection mask layer 130 gradually decreases along the moving direction of the laser, the newly formed grain boundary proceeds at an angle to the direction in which the laser moves, that is, processes in a direction about 90° to right and left edges of the reflection mask 130. Accordingly, as depicted in FIG. 7C, the grain boundaries cannot spread to the narrow width portion of the grain boundary filtering region 114. Also, sub-grain boundaries 250 formed due to the stress caused during the silicon crystallization process are blocked by the grain boundary filtering region 114.

Figure 7D:
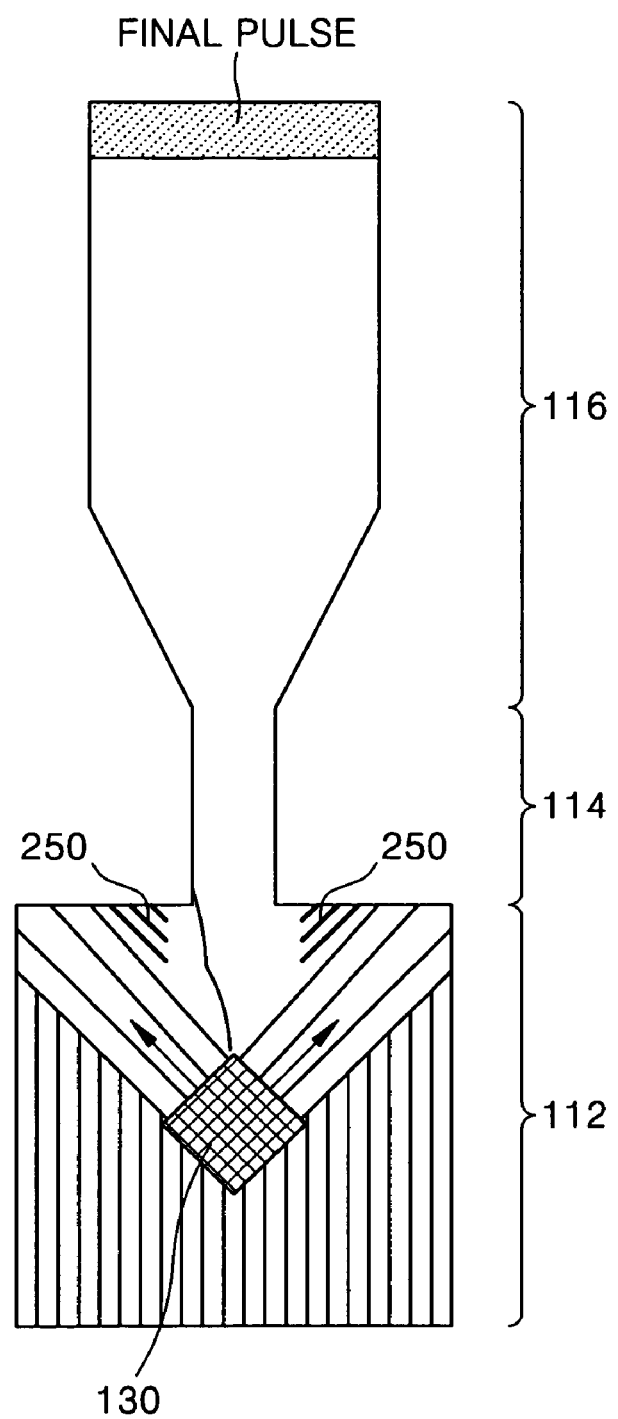

Referring to FIG. 7D, when the laser reaches the grain boundary-free single crystal region 116, the silicon crystallization process is completed. As described above, since the grain boundaries formed at the commencing point of the grain boundary growing commencing region 112 can not proceed straight ahead but proceed at an angle with respect to the laser moving direction, the grain boundaries do not proceed through the narrow portion of the grain boundary filtering region 114 and no grain boundaries exist in the grain boundary-free single crystal region 116. Therefore, the grain boundary-free single crystal region 116 has high electrical characteristics because the grain boundary-free single crystal region 116 is composed of a single crystal without grain boundaries.

Figure 7E:
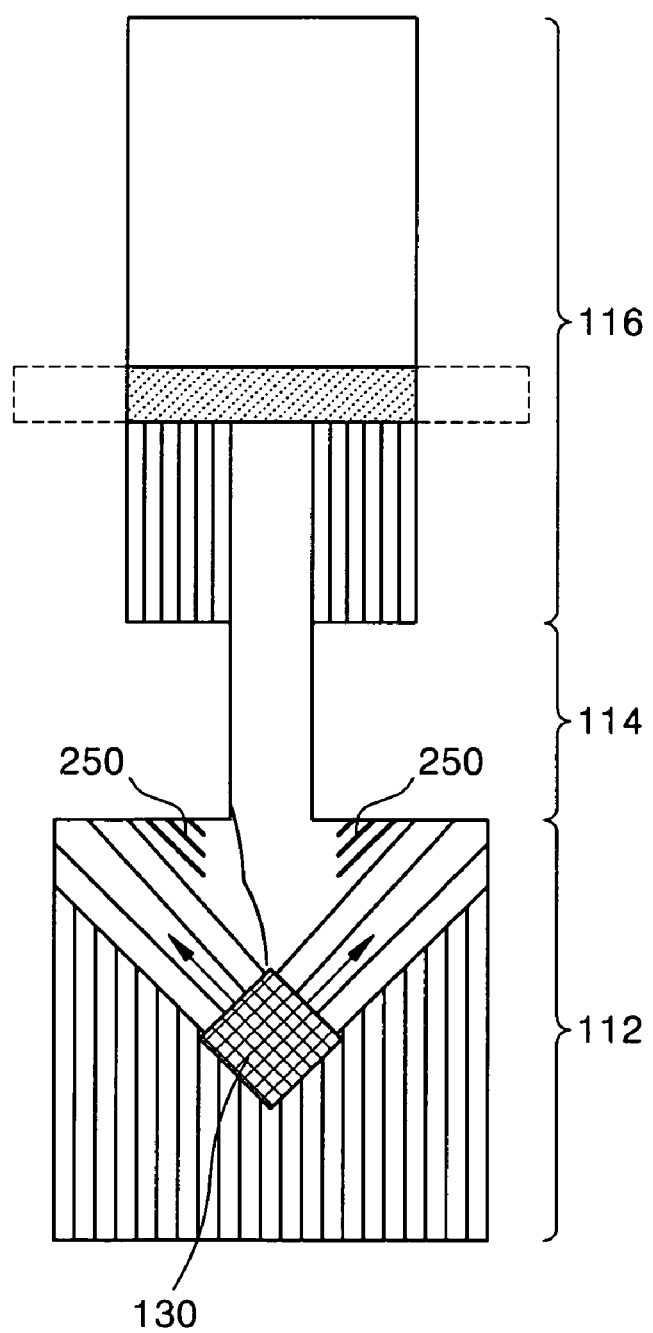

In order to prevent the formation of new grain boundaries along edges of the grain boundary-free single crystal region 116, the grain boundary filtering region 114 and the grain boundary-free single crystal region 116 must be connected with a tapered shape region. As depicted in FIG. 7E, if the grain boundary-free single crystal region 116 has a rectangular shape, grain boundaries will be formed at the edges of the grain boundary-free single crystal region 116 for the same reason that the grain boundaries form in the grain boundary growing commencing region 112.

Figure 9A:
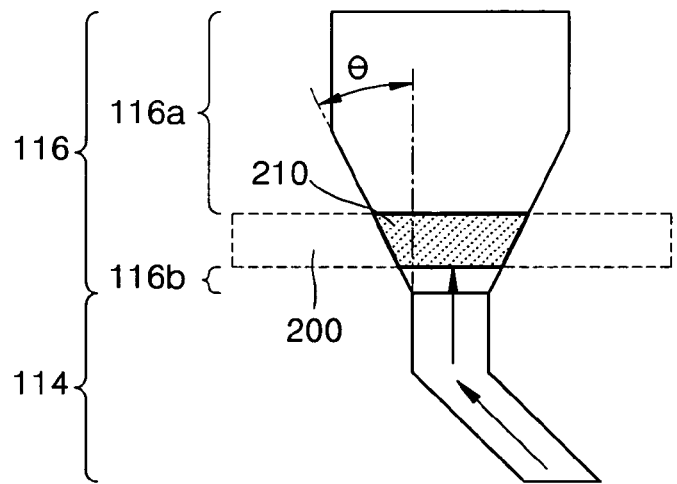
FIGS. 9A and 9B are drawings for describing a relationship between a taper angle and a change in position of a laser beam in a grain boundary-free region according to an embodiment of the present disclosure.
Figure 9B:
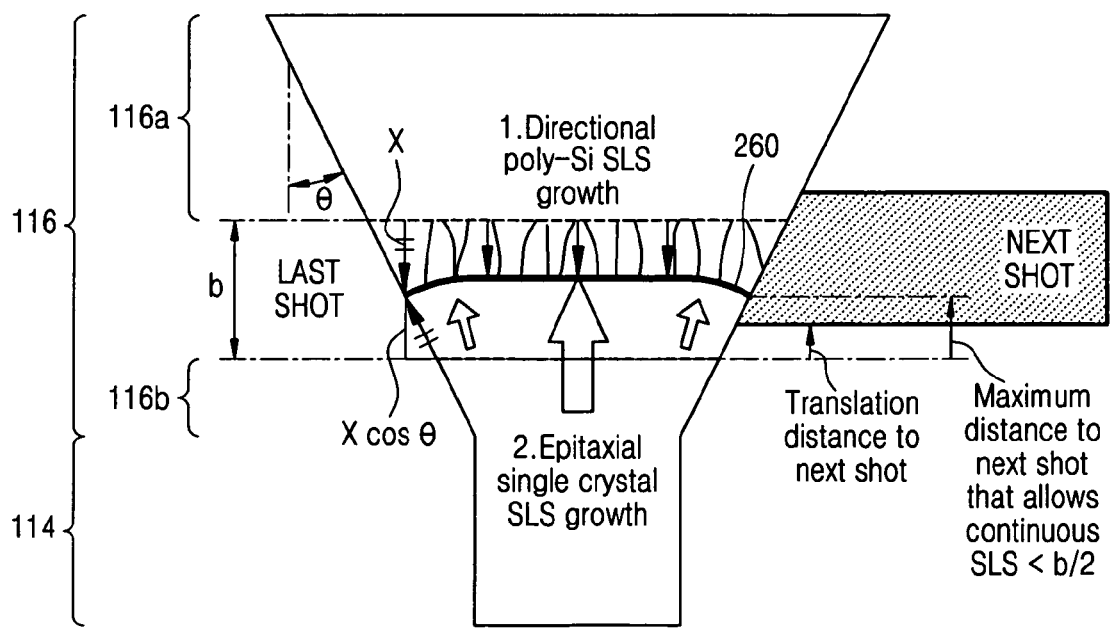

A relationship between the angle of the tapered portion of the grain boundary-free single crystal region 116 and the motion of the laser beam must meet the following conditions in this particular embodiment. FIG. 9A is a schematic diagram illustrating a laser beam irradiated onto the grain boundary-free single crystal region 116. Referring to FIG. 9A, a portion of the laser beam is irradiated onto a boundary region, that is, an already-crystallized single crystal silicon region 116b, and the other portion of the laser beam is irradiated onto a region to be crystallized, that is, an amorphous silicon region 116a. Hereinafter, a boundary of the laser beam irradiating the amorphous silicon region 116a will be referred to as a first beam boundary and a boundary of the laser beam irradiating the single crystal silicon portion 116b will be referred to as a second beam boundary. Referring to FIG. 9B, single crystal silicon grows near the second beam boundary but poly-Si having grain boundaries grows near the first beam boundary. The two types of silicon meet at a curve 260 shown in FIG. 9B.

Assuming the growing speeds of both type of silicon are equal, the two types of silicon will meet at the middle of the beam in the grain boundary-free single crystal region 116 since the crystals are growing in the vertical direction from the beam boundaries. However, the crystals are apt to grow along inclined edges in right and left sides of in the grain boundary-free single crystal region 116. Therefore, since a width of the beam boundary in the amorphous silicon region 116a is greater than that in the single crystal silicon region 116b, the two kinds of crystals meet at a point that a vertical distance from the boundary line of the amorphous silicon 116a and distance along in lined edge of single crystal silicon region 116b are same. As depicted in FIG. 9B, when the distance is x, the width of the laser beam is b, and the angle of the taper is θ, then the relationship between x, b, and θ is as follows.

$$b = x + x\cos\theta, \quad x = \frac{b}{1+\cos\theta} \quad \text{[Formula 1]}$$

To ensure that the two crystals meet at the midpoint of the beam, b/2 is smaller than $d_{C\text{-}SLG}$. $d_{C\text{-}SLG}$ is a maximum distance the crystal can grow from the beam boundary. This distance is determined by the composition of the grain boundary-free single crystal region 116, the energy of the laser beam, and the ambient temperature, etc. If the width of the beam is too high, the crystals will not meet at the middle point. Therefore, the following inequality is to be satisfied.

$$b/2 < d_{C\text{-}SLG} \quad \text{[Formula 2]}$$

In this way, when the crystallization is completed in the region on which the laser beam is irradiated, the laser beam is moved to next region to be crystallized. To grow the single crystal continuously, a boundary of the laser beam must be incident on the amorphous silicon and the other boundary of the laser beam must remain within the single crystal region and not go into the poly-crystal region, that is, in the region where the grain boundaries exist. Therefore, the maximum distance that the laser beam can be moved for a subsequent crystallization is limited to the distance by the end points of the curve 260. That is, the maximum distance can move for next crystallization must be less than X cos θ. Therefore, the following inequality has to be satisfied in consideration of the formula 1 and 2.

$$\text{The maximum moving distance of laser beam} < \frac{b\cos\theta}{1+\cos\theta} < \frac{2d_{C\text{-}SLG}\cos\theta}{1+\cos\theta} \quad \text{[Formula 3]}$$

In this manner, the crystallization is performed by moving the laser beam little by little, since the single crystal is grown continuously from the second beam boundary, when the crystallization is completed, the entire grain boundary-free single crystal region 116 is a single crystal silicon without grain boundaries. Accordingly, when depositing a thin film transistor on the grain boundary-free single crystal region 116, a TFT having high electric characteristic and high speed can be obtained.

Figure 10:
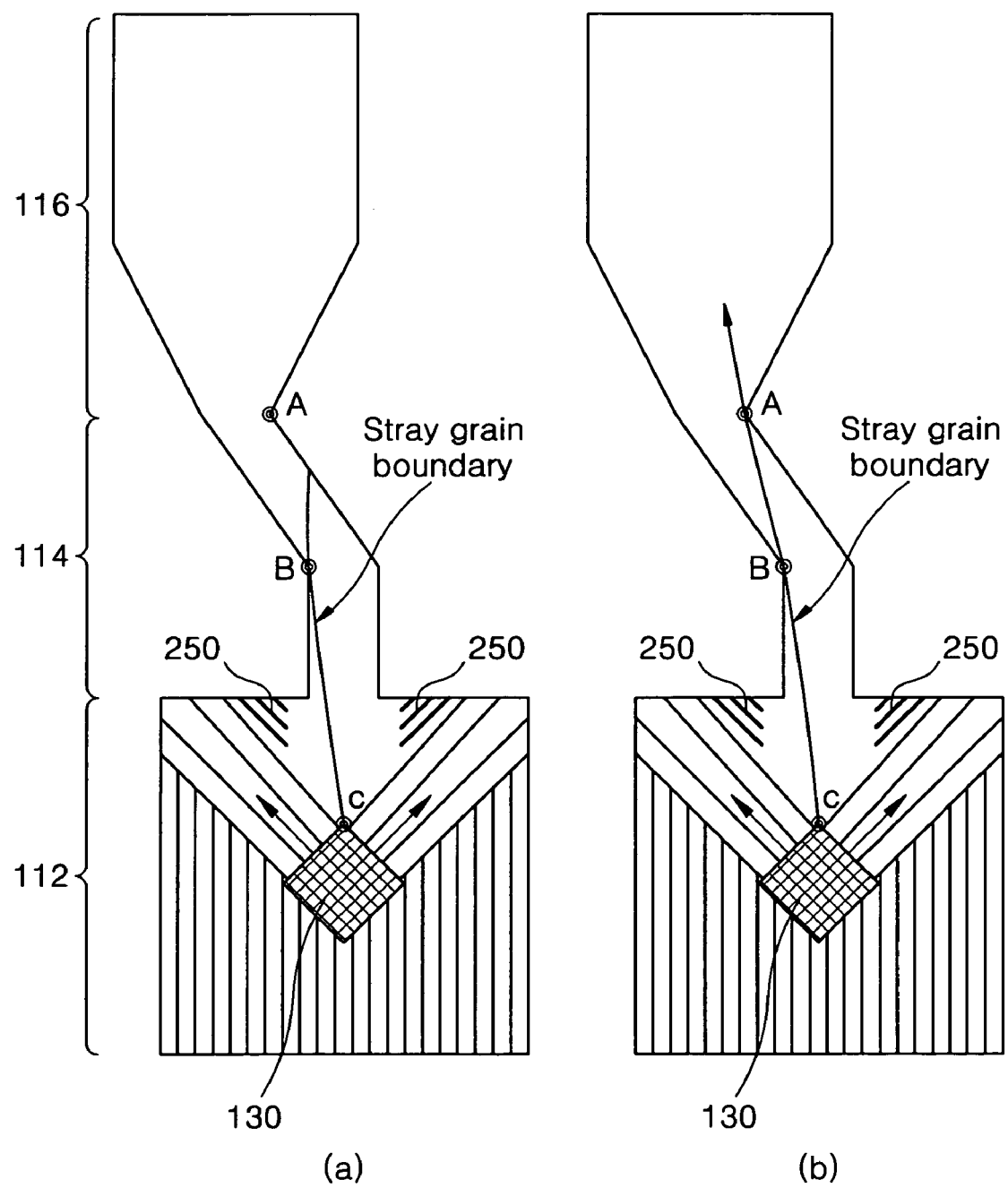
FIG. 10 is a drawing for describing a crystallization method according to a second embodiment of the present disclosure.

However, from time to time, as depicted in FIG. 10, a large grain boundary can occur at an apex C of the reflection mask layer 130 when crystallizing by the method described above, and, according to the first embodiment, the large grain boundary will spread into the grain boundary-free single crystal region 116. If a grain boundary exists in the grain boundary-free single crystal region 116, the performance of a transistor to be formed in a subsequent process will be deteriorated significantly. Therefore, a measure must be taken to prevent the large grain boundary from reaching to the grain boundary-free single crystal region 116. In crystallizing methods according to second through fourth embodiments of the present disclosure, the large grain boundary is prevented from reaching the grain boundary-free single crystal region 116.

FIG. 10 is a drawing for describing a crystallization method according to a second embodiment of the present disclosure. Referring to FIG. 10, in the patterned amorphous silicon layer 110, a grain boundary filtering region 114 is not straight but is bent twice. That is, after first bending with a predetermined angle, the grain boundary filtering region 114 is bent once more in an opposite direction at the predetermined angle. Except for the bend in the grain boundary filtering region 114, the structure of the pattered amorphous oilicon layer in the second embodiment is the same as in the first embodiment. That is, the second embodiment also has the same layer structure as depicted in FIG. 8, and the patterned a-Si layer 110 comprises the grain boundary growing commencing region 112 with a rectangular shape, the grain boundary filtering region 114 having a narrow width and extending from the grain boundary growing commencing region 112, and the grain boundary-free single crystal region 116 having a greater width than the grain boundary filtering region 114 and having a tapered shape in a connecting portion connected to the grain boundary filtering region 114. A reflection mask layer 130 having windings or an apex for changing direction in which a grain boundary proceeds is formed in a central portion of the grain boundary growing commencing region 112 of the patterned a-Si layer 110.

A crystallization process is performed by sequentially irradiating the laser beam commencing from an end of the grain boundary growing commencing region 112 to the grain boundary-free single crystal region 116, as in the first embodiment, and the limitation of moving the laser beam after completing crystallization in a region is the same as in the first embodiment.

In the second embodiment, since the grain boundary filtering region 114 is bent, a grain boundary starting at the apex C of the reflection mask layer 130 can not reach the grain boundary-free single crystal region 116 because it is blocked by the grain boundary filtering region 114. To completely prevent the grain boundary from reaching the grain boundary-free single crystal region 116, the grain boundary filtering region 114 must be bent with a sufficient angle. As depicted in FIG. 10b, if a line can connect the apex C of the reflection mask layer 130, an inner bending point B of the first bending region, and an inner bending point A of the second bending region, the grain boundary can reach the grain boundary-free single crystal region 116 via the grain boundary filtering region 114. Therefore, a slope of the line connecting the apex C and the point B must greater than the slope of the line connecting the point B and the point A. Under this condition, the possibility of a grain boundary starting at the apex C of the reflection mask layer 130 reaching the grain boundary-free single crystal region 116 is very low.

Figure 11:
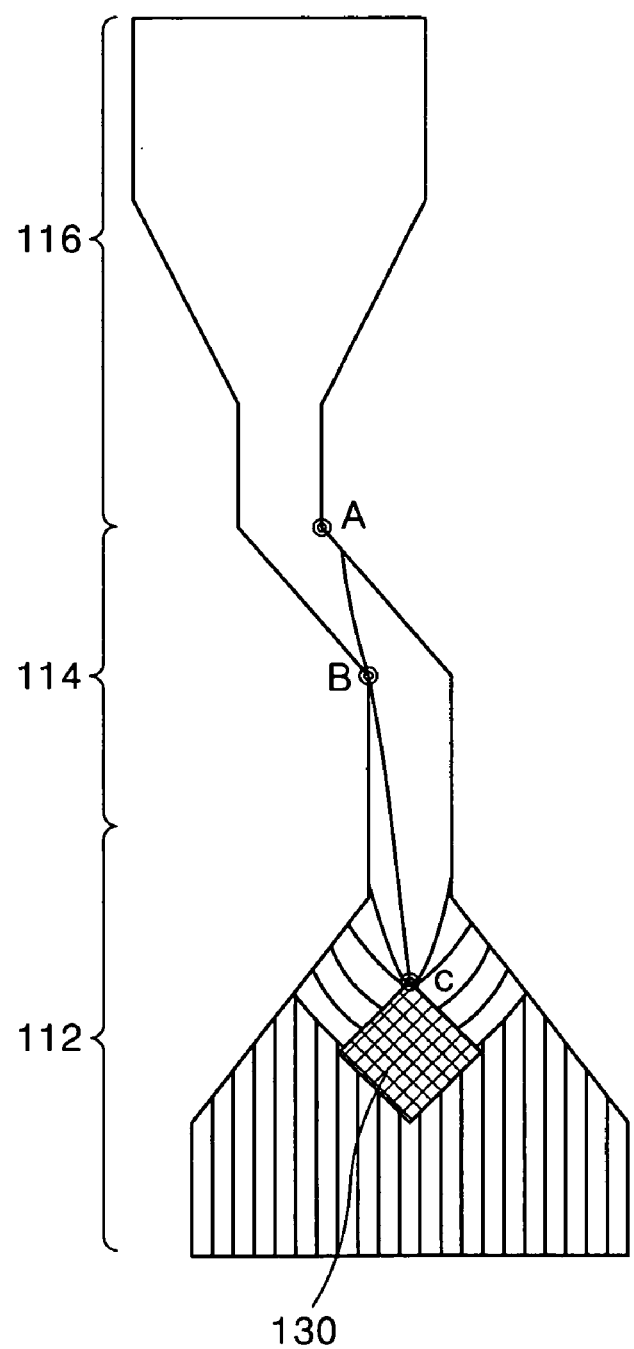
FIG. 11 is a drawing for describing a crystallization method according to a third embodiment of the present disclosure.

FIG. 11 illustrates a crystallization method according to a third embodiment of the present disclosure. Referring to FIG. 11, a width of the grain boundary growing commencing region 112 gradually decreases closer to the grain boundary filtering region 114. Grain boundaries generated at the reflection mask layer 130 have to proceed in a vertical direction with respect to each of the sides of the reflection mask layer 130. However, while forming the crystallization process by moving the laser beam, the direction of the grain boundaries can gradually shift toward the moving direction of the laser. In this case, the grain boundaries can reach the grain boundary-free single crystal region 116 via the grain boundary filtering region 114.

The method of the third embodiment prevents this possibility. Referring to FIG. 11, a width of the grain boundary growing commencing region 112 gradually decreases toward the grain boundary filtering region 114. That is, a change in the direction of the grain boundaries is prevented since the corners of the grain boundary growing commencing region 112 are cut. The ability to prevent the spreading of the grain boundaries can be further increased by reducing the distance between the reflection mask layer 130 and the grain boundary filtering region 114.

Figure 12:
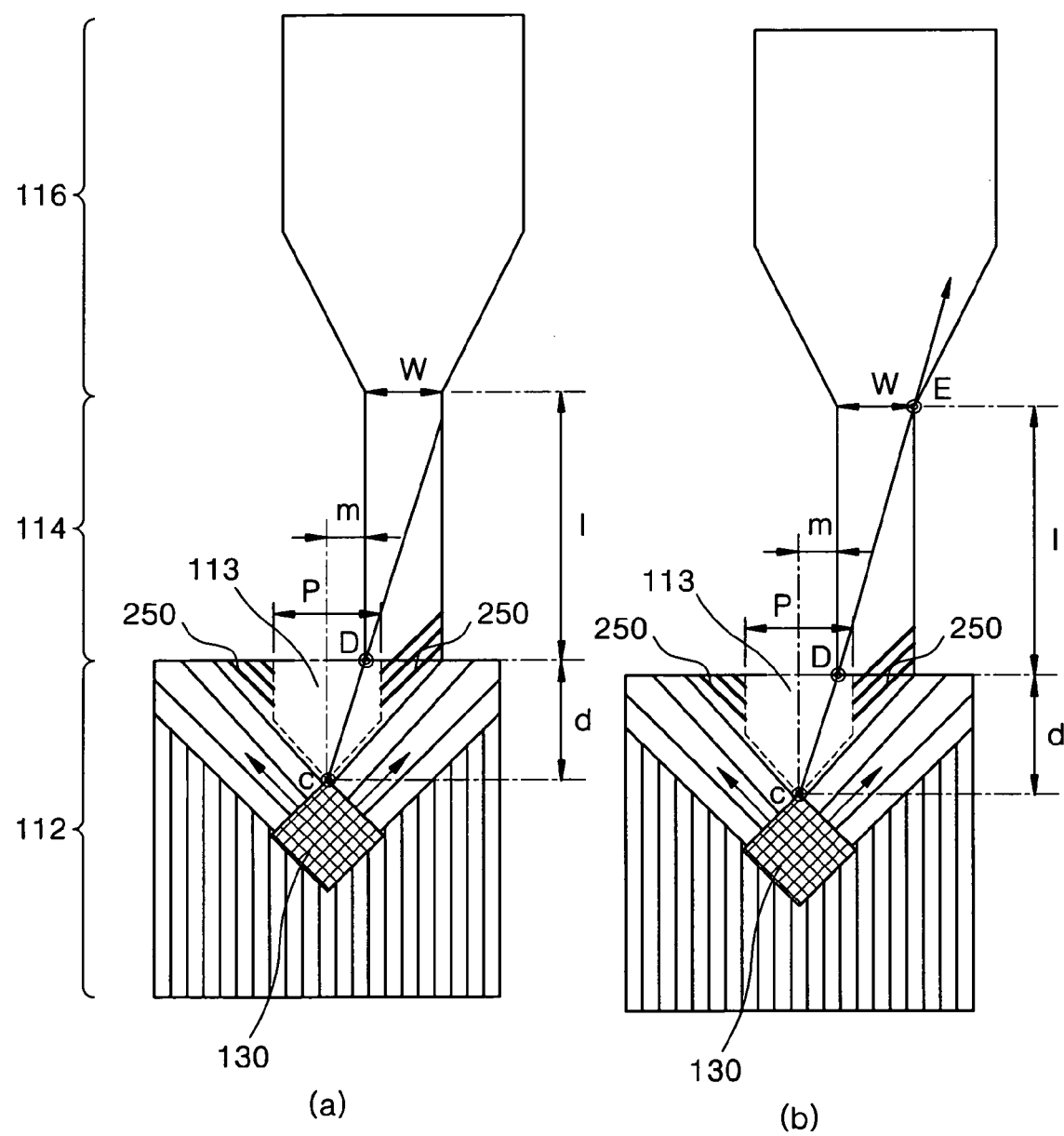
FIG. 12 is a drawing for describing a crystallization method according to a fourth embodiment of the present disclosure.

FIG. 12 is a drawing illustrating crystallization method according to a fourth embodiment of the present disclosure. A large grain boundary extending from an apex C of the reflection mask layer 130 can be prevented in the fourth embodiment. In the first embodiment, the grain boundary filtering region 114 extends from the center of the grain boundary growing commencing region 112, but, as depicted in FIG. 12, in the fourth embodiment, the grain boundary filtering region 114 extends from a location not centered on the grain boundary growing commencing region 112. The remaining features of the fourth embodiment are identical to the first embodiment. Since the grain boundary filtering region 114 extends from a location not from the centered on the grain boundary growing commencing region 112, the grain boundary formed vertically at the apex C of the reflection mask layer 130 can be blocked. However, in this case, a grain boundary generated obliquely at the apex C of the reflection mask layer 130 can reach the grain boundary-free single crystal region 116. In order to prevent this, the following conditions are met.

Referring to FIG. 12(b), if the length of the grain boundary filtering region 114 is too short, a grain boundary generated obliquely at the apex C of the reflection mask layer 130 can reach the grain boundary-free single crystal region 116 via the grain boundary filtering region 114. In a limiting case, if the apex C of the reflection mask layer 130, a point D closest to the apex C of the reflection mask layer 130 at the boundary between the grain boundary filtering region 114 and the grain boundary growing commencing region 112, and a point E farthest from the point D at the boundary between the grain boundary filtering region 114 and the grain boundary-free single crystal region 116 form a straight line, the grain boundary starting at the apex C of the reflection mask layer 130 can reach the grain boundary-free single crystal region 116. Therefore, the length of the grain boundary filtering region 114 must be sufficiently long. That is, the slope of the line between the points D and E must be greater than the slope of the line between the points C and D.

In other words, when a distance travelled by the laser from the apex C of the reflection mask layer 130 to an edge of the grain boundary growing commencing region 112 is d, a distance between the center of the edge of the grain boundary growing commencing region 112 and the grain boundary filtering region 114 is m, the length of the grain boundary filtering region 114 is l, and the width of the grain boundary filtering region 114 is w, the following inequality is satisfied.

$$m/d > w/l \qquad \text{[Formula 4]}$$

As described above, the single crystal portion 113 on which no grain boundaries are formed during crystallization is grown almost symmetrically from the apex C of the reflection mask layer 130. A width of the single crystal portion 113 is fixed in a direction of crystal growth due to the sub-grain boundaries caused by stresses generated during crystallization. In order for the single crystal portion 113 to spread to filtering region 114, at least a portion of the single crystal portion 113 overlap the grain boundary filtering region 114. Therefore, in the fourth embodiment, the grain boundary filtering region 114 must not be excessively deviated from the center of the grain boundary growing commencing region 112. That is, as depicted in FIG. 12, if the width of the single crystal portion 113 is P, the following inequality is satisfied.

$$M < P/2 \qquad \text{[Formula 5]}$$

In the fourth embodiment, when formulae 4 and 5 are satisfied, single crystal silicon without grain boundaries can be formed stably while preventing grain boundaries from reaching the grain boundary-free single crystal region 116.

According to the present disclosure, a single crystal silicon thin film without grain boundaries can be formed stably and uniformly, thereby preventing defects. Also, a single crystal silicon thin film having a much greater area than in the conventional art can be formed. Accordingly, a high performance thin film transistor having high electrical characteristics can be formed since the single crystal silicon thin film having high electrical characteristics. Also, mass production is possible because crystallization of each of the regions for forming each of the transistors is unnecessary. Thus, a TFT LCD can be manufactured by a simple process with speed and preciseness.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of forming a single crystal silicon thin film by crystallizing an amorphous silicon layer deposited on a substrate, comprising:
   patterning the amorphous silicon layer into first, second, and third regions, the second region having a narrower width than the first and third regions to prevent grain boundaries from reaching the third region, wherein the second region connects the first region where the crystallization commences and the third region where a single crystal without beam boundaries can grow;
   partially forming a mask layer on the first region; and
   crystallizing the amorphous silicon layer by irradiating a laser beam from the first region to the third region in steps using a linear beam SLS method.

2. The method of claim 1, wherein a portion of the third region is tapered toward the second region.

3. The method of claim 2, wherein a remaining portion of the third region maintains a uniform width.

4. The method of claim 1, wherein the mask layer is composed of a material that reflects light.

5. The method of claim 4, wherein the mask layer is composed of a material that includes aluminum.

6. The method of claim 4, wherein the mask layer has a shape having apexes.

7. The method of claim 6, wherein the mask layer, an apex of which is located in a direction facing the second region so that a direction of the grain boundary commenced to grow in the first region can change to a tilted direction.

8. The method of claim 7, wherein the apex of the mask layer is located on a center line centered between opposite sides of the first region.

9. The method of claim 8, wherein the mask layer is symmetrical about the center line of the first region.

10. The method of claim 1, wherein $$\left\{\frac{b}{2} < d_{C-SLG}\right\}$$

is satisfied where b is the width of the laser beam and $d_{C-SLG}$ is a maximum distance that the grain boundaries can grow from the beam boundary line.

11. The method of claim 10, wherein the maximum distance that the laser beam travels in the tapered region during each step is $$\frac{2d_{C-SLG}\cos\theta}{1+\cos\theta}$$

where θ is the taper angle with respect to the moving direction of the laser beam.

12. The method of claim 11, wherein the second region extends in the moving direction of the laser from a center of a side of the first region.

13. The method of claim 12, wherein the second region is bent at least twice at a predetermined angle.

14. The method of claim 13, wherein the second region has a first bend with a predetermined angle and a second with the predetermined angle in a direction opposite to the first bend with an angle as much as the first angle, and the first bend is closer to the first region than the second bend.

15. The method of claim 14, wherein the slope of a line between an apex of the mask layer and the inner bending point of the first bend is greater than the slope of a line between the inner bending point of the first bend and the inner bending point of the second bend.

16. The method of claim 13, wherein the width of the first region gradually decreases toward the second region.

17. The method of claim 11, wherein the second region extends in the moving direction of the laser from a portion of the first region with a predetermined distance from the center of a side of the first region.

18. The method of claim 17, wherein $$\left\{\frac{m}{d} > \frac{w}{l}\right\}$$

is satisfied, where d is a vertical distance from an apex of the mask layer to a side fo the first region along the laser moving direction, m is a horizontal distance from the center line of the first region to the closest side of the second region to the center line, l is the length of the second region, and w is the width of the second region.

19. The method of claim 18, wherein $$\left\{m < \frac{p}{2}\right\}$$

is satisfied, where P is a width of the single crystal formed in the first region.

* * * * *